United States Patent
Gittinger et al.

[11] Patent Number: 5,668,815
[45] Date of Patent: Sep. 16, 1997

[54] METHOD FOR TESTING INTEGRATED MEMORY USING AN INTEGRATED DMA CONTROLLER

[75] Inventors: Robert Paul Gittinger; David Allen Spilo, both of Austin, Tex.

[73] Assignee: Advanced Micro Devices, Inc., Sunnyvale, Calif.

[21] Appl. No.: 696,734

[22] Filed: Aug. 14, 1996

[51] Int. Cl.$^6$ ..................................................... G06F 11/00
[52] U.S. Cl. ........................................ 371/21.2; 371/21.3
[58] Field of Search ................................. 371/21.2, 21.3, 371/21.1; 395/183.03, 183.06, 183.07

[56] References Cited

U.S. PATENT DOCUMENTS 4,701,845 10/1987 Andreasen et al. ..................... 364/200
4,888,773 12/1989 Arlington et al. ....................... 371/40.2

Primary Examiner—Vincent P. Canney
Attorney, Agent, or Firm—Kevin L. Daffer; Conley, Rose & Tayon

[57] ABSTRACT

A microcontroller includes an integrated memory and an integrated DMA controller. During testing, the DMA controller is used to perform read/write tests of background patterns and complements thereof to the integrated memory. The integrated memory need not contain the BIST logic typically required of integrated memories. By using the DMA controller to perform BIST-type testing, the tests are not hardware-bound. Typically, the BIST logic included in integrated memories is designed and tested during the design of the microcontroller. This design and test time is replaced by a (possibly shorter) task of generating test vectors for the requisite DMA transfers. The risk of having an error in the BIST test is reduced using the present testing method. Formerly, if BIST logic was found to be in error, new manufacturing masks for the microcontroller were required to repair the problem. A large time and monetary investment was required. The present method allows for correction and variation in the testing by resimulating the tests and creating new test vectors. The new test vectors may then be applied to previously manufactured microcontrollers.

23 Claims, 9 Drawing Sheets

METHOD FOR TESTING INTEGRATED MEMORY USING AN INTEGRATED DMA CONTROLLER

BACKGROUND OF THE INVENTION

1. Field of the Invention

This invention relates to the field of integrated circuits and, more particularly, to testing of integrated memory within an integrated circuit.

2. Description of the Relevant Art

Integrated circuits have become ubiquitous in modern society. Products as diverse as automobiles, computer systems, televisions and telephones incorporate one or more integrated circuits to perform various functions. Generally speaking, an integrated circuit comprises circuitry formed upon a single monolithic semiconductor substrate. The integrated circuit implements one or more cores which perform the various functions of the integrated circuit as well as circuitry for communicating with other integrated circuits and devices external to the integrated circuit. A core is circuitry connected together to provide a desired high level function. For example, a processor core is circuitry which executes a set of instructions. Other cores may be a digital signal processing core configured to process signals, a cache controller core for managing a block of external memory as a cache, etc.

One popular type of integrated circuit is a microcontroller, which comprises a processor core as well as communications cores for various serial and parallel port connections to peripheral devices. Microcontrollers allow programmable control (via the processor core) of the peripherals connected thereto. Microcontrollers are commonly employed in a wide variety of devices including printers, cellular phones, automobiles, etc. Generally, a microcontroller is employed as the primary control chip in an electronic circuit embedded within a product other than a general purpose computer system (i.e. the so-called "embedded applications"). The microcontroller and related circuitry is employed to satisfy the computing demands of a product whose general purpose is not computing (i.e. a television, telephone, or automobile).

Modern microcontrollers incorporate not only a processor core and communications cores, but also integrate other devices commonly employed therewith. Particularly, microcontrollers have begun to integrate blocks of memory. Integrating previously discrete components such as memory may lead to cost savings in the final product, since fewer components are needed. However, integrating memory into a microcontroller generates the need to test the memory for functionality when the microcontroller is manufactured. Memories are generally constructed using minimum transistor dimensions, minimum spacing between transistors, and minimum-sized contacts. Therefore, memories are particularly vulnerable to defects introduced in the fabrication process. Defects can be introduced due to dust particles on the chips or the masks, scratches, gate oxide pinholes, and misalignment of masks, for example.

Typically, built in self-test (BIST) logic is included for performing the memory testing. The BIST logic is enabled when the test is desired, and the BIST logic reports the success or failure of the test in a manner which may be detected external to the microcontroller. For example, a pin may be asserted or deasserted. Alternatively, a status register may be updated, and the status register may be read to determine the pass/fail status of the BIST.

Memory defects may be classified as stuck-at faults, stuck-open faults, transition faults, state coupled faults, multiple access faults and data retention faults. A memory cell (or bit location) is said to be stuck-at if a read from the cell is always at a certain logic value regardless of the read/write activity performed on the cell or any influence from other cells. A memory cell is said to be stuck-open if it can never be accessed. A memory cell with a transition fault will fail to undergo at least one of the transitions from 0 to 1 or 1 to 0 when the cell is repeatedly written. A memory cell is said to be state coupled to another cell if the first cell is fixed at a certain value only if the second cell is in one defined state. The testing of state coupled faults requires demonstrating that any arbitrary pair of cells in the memory is able to be in 0-0,0-1,1-0, and 1-1 states. A memory cell is said to have a multiple access fault if a single read/write action accesses multiple cells. Finally, a memory cell with a data retention fault is unable to retain the charge stored therein (representing a binary one or a binary zero) for a minimum required period.

A 9N or 13N test algorithm (where N is the number of addresses in the memory and 9 or 13 refers to the number of accesses to each memory cell within one pass of the test) is typically employed by BIST logic to test all of the faults outlined above. Generally, the algorithms involve reading and writing both a selected "background" pattern and the complement of the background pattern. Once the memory is initialized to the selected background pattern, each memory cell is read to verify the selected background pattern, written with the complement of the background pattern, and then read again to verify the selected background pattern. The background pattern comprises a set of binary ones and zeros selected to stress cells which are physically located near one another. For example, the background patterns may be selected to update a cell to a binary one while an adjacent cell or cells is updated to a binary zero (and vice-versa). Other background patterns are selected such that a particular cell is updated to a binary one (or zero) while adjacent cells remain constant at a certain value. Further details regarding the 9N and 13N test algorithms may be found in Rob Dekker, Frans Beenker, Loek Thijssen, "A Realistic Fault Model & Test Algorithms for Static Random Access Memories," IEEE Log Number 9034766 (Jul. 10, 1989), which is hereby incorporated by reference.

Unfortunately, the BIST logic presents an onerous design burden for microcontrollers and other integrated circuits. Microcontrollers are generally sold for relatively low prices and in high volumes, so microcontroller designs are extraordinarily cost-conscious designs. The die size of the semiconductor substrate is minimized to enhance yield and number of product produced per semiconductor wafer. The BIST logic may consume a significant amount of the available die area. It is possible, for example, for approximately 3–5% or even more of the die area to be dedicated to the BIST logic.

Another problem presented by the BIST logic is that it requires access to the memory. Therefore, the BIST logic's address, data, read/write controls, and other control signals must be incorporated into the ports (or access points) of the memory array. Multiplexors or other selection devices used to select between competing access requests must therefore include another input for the BIST logic. These multiplexors therefore become not only larger, but also slower, requiring additional time to propagate a value. Therefore, the clock cycle time (or frequency) achievable by the microcontroller may be impacted by the inclusion of the BIST logic. It is therefore desirable to provide an alternative to the BIST logic method of testing an integrated circuit having an integrated memory.

SUMMARY OF THE INVENTION

The problems outlined above are in large part solved by a microcontroller in accordance with the present invention. The microcontroller includes an integrated memory and an integrated DMA controller. During testing, the DMA controller is used to perform read/write tests of background patterns and complements thereof to the integrated memory. Advantageously, the integrated memory need not contain the BIST logic typically required of integrated memories. Die area formerly dedicated to BIST logic is freed for other uses or for reduction of total die size. Furthermore, input/output circuitry of the integrated memory is simplified with respect to integrated memories including BIST logic. The present integrated memory may therefore be characterized with a faster access time the a comparable integrated memory including BIST logic.

Using the DMA controller as described herein is a highly efficient method for performing the BIST-type test. Two DMA channels are used concurrently to provide the required read of the background pattern, write of the complement of the background pattern, and read of the complement of the background pattern at each memory location. The second DMA channel reads each memory location for verification of the background pattern, while the first DMA channel is responsible for updating each memory location to the complement of the background pattern and for reading the memory location to verify the complement of the background pattern is stored therein. The read portion of the DMA transfer performed by the second DMA channel and both the read and write portions of the DMA transfer performed by the first DMA channel perform required portions of the test algorithm. The method using the DMA controllers is substantially more efficient than using instructions to perform the memory test itself (i.e. multiple move instructions to each of the memory locations within the integrated memory). These instructions must be fetched, occupying the shared internal bus as well as the external bus for additional bus cycles besides those needed to perform the read and write accesses of the test. In contrast, a small number of instructions are executed to configure the DMA controller and then the read and write access proceed uninterrupted for each pass of the test through the integrated memory.

The order of test operations to a given memory location is the order specified by the 13N test algorithm, but the operations to adjacent memory locations are intermingled with each other. The second DMA channel reads a particular location, followed by the first DMA channel reading a first location adjacent to the particular location and updating the particular location with the value read from the first location. Subsequently, a second location adjacent to the particular location is read by the second DMA channel, followed by the first DMA channel reading the particular location and updating the second location with the value read from the particular location. In this manner, the first and second DMA channels efficiently provide the required read and write tests: each memory location is verified as readable and writeable to the background pattern and the complement of the background pattern with each other memory location storing either the background pattern of the complement of the background pattern.

Yet another advantage of using the DMA controller to perform BIST-type testing is that the tests are not hardware-bound. Typically, the BIST logic included in integrated memories is designed and tested during the design of the microcontroller. A substantial amount of design and test time must be invested in order to create and ensure correct operation of the BIST logic. Advantageously, this design and test time is replaced by a substantially less time consuming task of generating test vectors for the requisite DMA transfers. The design costs are thereby reduced, which may contribute to cost reduction for the final microcontroller product. Furthermore, the risk of having an error in the BIST test is reduced using the present testing method. Formerly, if BIST logic was found to be in error, new manufacturing masks for the microcontroller were required to repair the problem. A large time and monetary investment was required. Similarly, if it was desired to change the nature of the BIST testing in some manner, the microcontroller had to be manufactured with new masks. On the other hand, the present method allows for correction and variation in the testing by resimulating the tests and creating new test vectors. The new test vectors may then be applied to previously manufactured microcontrollers.

Broadly speaking, the present invention contemplates a method for testing a memory of an integrated circuit having an integrated DMA controller. A plurality of storage locations comprising the memory are initialized to a predefined value. A first DMA transfer is performed in the DMA controller to access each of the plurality of storage locations. A second DMA transfer is performed in the DMA controller to update each of the plurality of storage locations to a complement of the predefined value. The present invention further contemplates the integrated circuit tested by this method.

The present invention still further contemplates an integrated circuit comprising a memory and a DMA unit. The memory comprises a plurality of storage locations integrated into the integrated circuit. Coupled to the memory, the DMA unit is adapted during use to perform a first DMA transfer to update each of the plurality of storage locations to a predefined value and to perform a second DMA transfer to access each of the plurality of storage locations.

BRIEF DESCRIPTION OF THE DRAWINGS

Other objects and advantages of the invention will become apparent upon reading the following detailed description and upon reference to the accompanying drawings in which.

Figure 1:
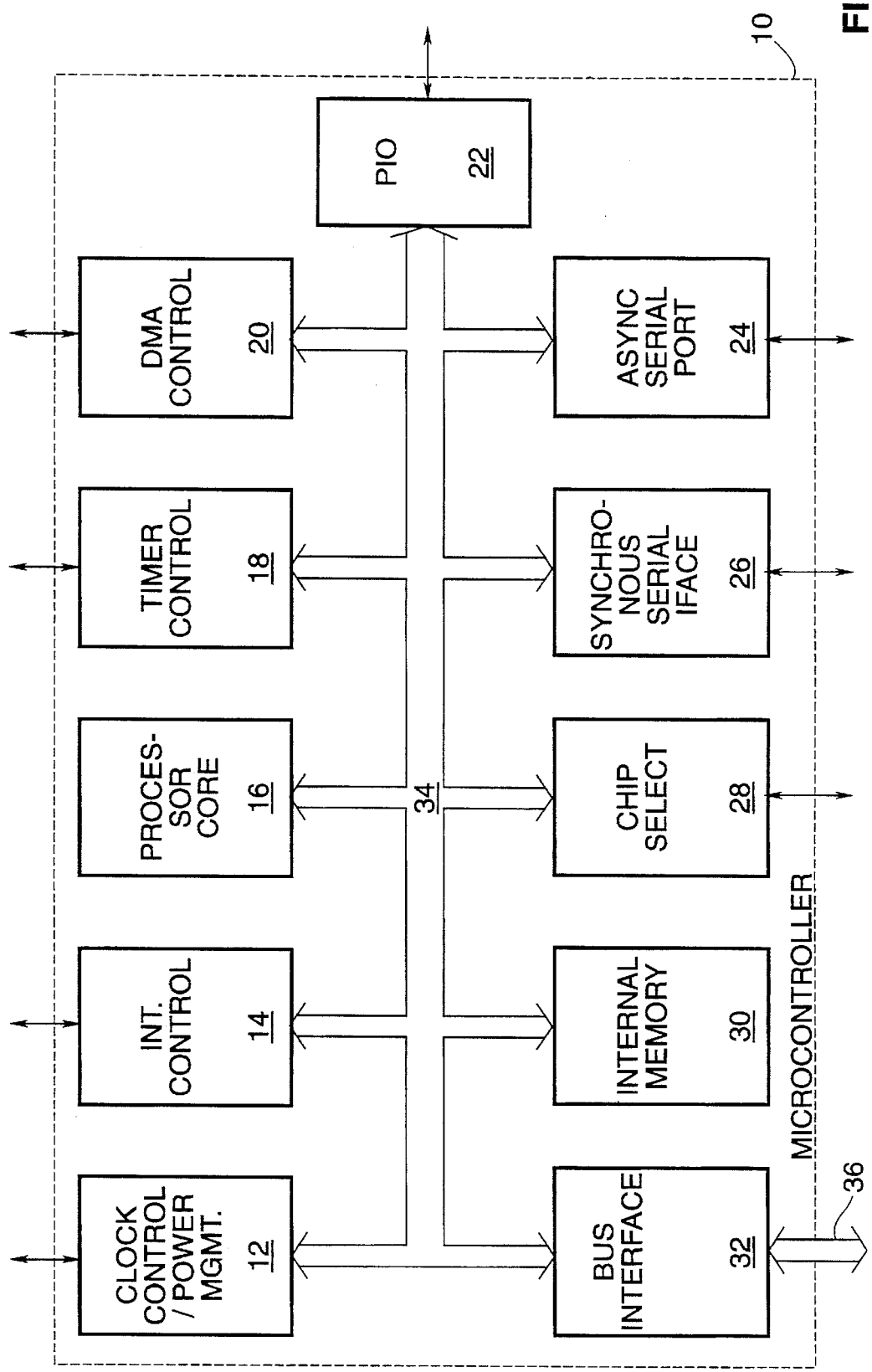
FIG. 1 is a block diagram of one embodiment of a microcontroller.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of one embodiment of a microcontroller 10 is shown. In the embodiment shown, microcontroller 10 is formed upon a single monolithic semiconductor substrate. Other embodiments are contemplated. Microcontroller 10 includes a clock/power management unit 12, an interrupt control unit 14, a processor core 16, a timer control unit 18, a DMA control unit 20, a programmable input/output (PIO) unit 22, an asynchronous serial interface 24, a synchronous serial interface 26, a chip select unit 28, an internal memory 30, and a bus interface unit 32. An internal bussing 34 interconnects the various elements 12–32 of microcontroller 10 by which the various elements 12–32 communicate with each other. In one embodiment, microcontroller 10 is an 80C186-compatible microcontroller.

In order to test internal memory 30, DMA control unit 20 is employed to initialize internal memory 30 to a selected background pattern and then to perform read and write tests of the background pattern and the complement of the background pattern upon internal memory 30. Advantageously, the BIST logic may be discarded in favor of using DMA transfers to perform the BIST. Since DMA control unit 20 is useful for other operations during normal use (i.e. DMA transfers), the built in self test functionality requires no additional area or circuitry. It is noted that the "complement" of a particular value, as used herein, contains the inverse of each bit in the particular value in the corresponding bit location. In other words, the complement is the logical inverse of the particular value. For example the complement of the value 0100 (in binary) is 1011 (in binary).

In one embodiment, two DMA channels are used to perform the read and write tests of the background and the complement of the background concurrently. The second DMA channel reads the selected background value from each memory location of internal memory 30 and stores the value to an arbitrary memory location external to internal memory 30. The second DMA channel thereby verifies that the selected background pattern is correctly written to and read from each memory location within internal memory 30. The first DMA channel initially reads a location external to internal memory 30 but adjacent thereto, thereby being provided with the complement of the background value. The value read from the external location is stored into the least significant address of internal memory 30. The first channel than reads the updated location and updates the second least significant address of internal memory 30. The first DMA channel thereby verifies that the complement of the selected background pattern is correctly written to and read from each memory location within internal memory 30.

The first DMA channel follows the second DMA channel in accessing a particular location, thereby guaranteeing that the second DMA channel reads a particular storage location prior to that storage location being updated by the first DMA channel. In one embodiment, the test is performed with microcontroller 10 in the "show read" mode (described below), such that the read data for the read portion of the DMA transfer appears upon the pins of microcontroller 10, thereby being detectable by a test apparatus being used to test microcontroller 10. The two DMA channels are programmed to be of equal priority and source-synchronized. By asserting the DMA request pins concurrently, the DMA channels can be started concurrently and the ordering relationship between them guaranteed by DMA control unit 20.

Processor core 16 includes circuitry for executing a set of instructions defined by the microprocessor architecture employed by processor core 16. In one embodiment, processor core 16 is an 80C186 compatible processor core. Processor core 16 fetches instructions and certain instruction operands from an internal memory 30 and from an external memory, based upon the addresses employed in the instruction code being executed and the regions of the address space assigned to internal memory 30 and the external memory. If the access is to internal memory 30, then the access completes via bussing 34. For write accesses (i.e. processor core 16 is updating a memory location), the write operation and data being updated is broadcast by bus interface unit 32 upon an external bus 36. For read accesses to internal memory 30, the address is broadcast upon external bus 36 but the data being read is generally not broadcast. It is noted that the term access refers to either a read (a transfer of data from the accessed storage location to the transfer initiator, e.g. processor core 16) or a write (a transfer of data from the transfer initiator to the accessed storage location). Write accesses may also be referred to as updates.

Microcontroller 10 employs a mechanism to aid users in debugging, referred to as a "show read" mode. The show read mode is entered if, upon deassertion of the reset signal to microcontroller 10, a signal upon a predefined pin is asserted. Alternatively, a configuration register may be programmed by a software instruction to enable the show read mode. In show read mode, when processor core 16 performs a read access to internal memory 30, the data being read from internal memory 30 is conveyed by bus interface unit 32 upon external bus 36. The data being transferred to processor core 16 from internal memory 30 thereby becomes visible external to microcontroller 10. The functional timing of the read data upon external bus 36 is consistent with the functional timing required for external read data (e.g. data provided by an external memory). Furthermore, the A/C timing of the show read bus transfers is consistent with the A/C timing of other reads. More particularly, the setup time (i.e. the amount of time prior to a particular clock edge upon which the data is captured that the data must be valid upon the bus) and the hold time (i.e. the amount of time subsequent to the particular clock edge that the data bus be valid upon the bus) are each greater than or equal to the corresponding setup and hold times for external reads.

Generally speaking, internal memory 30 may comprise any type of memory storage. A memory storage comprises a plurality of storage locations (or "memory locations"). Each storage location is selectable by a unique address for read and write accesses. In one embodiment internal memory 30 comprises 32 kilobytes of random access memory (RAM). The RAM may comprise static RAM (SRAM) cells or dynamic RAM (DRAM) cells, for example. The cells in the present embodiment are arranged such that a sixteen bit word can be read or written for each address which accesses the memory. It is noted that words may comprise other numbers of bits in other embodiments. Furthermore, any desired RAM configuration may be employed. Additionally, bus interface unit 32 generally provides the circuitry for communicating upon external bus 36 in accordance with the protocol of the 80C186 interface.

Clock control/power management unit 12 receives an input oscillating signal from an external oscillator (not shown), and generates internal and external clocking signals from the input oscillating signal. The internal and external clocking signals may operate at full speed, or may operate in a power saving mode at a lower frequency than the full speed frequency. Various algorithms for selecting the power saving mode are well known.

Interrupt control unit 14 receives interrupt signals from devices connected to microcontroller 10 ("peripheral devices"). Generally, a device interrupts microcontroller 10 when a specific service is needed by the device. For example, if a device is buffering input data and the buffer is full, the device may interrupt microcontroller 10. Microcontroller 10, in response to instructions in an interrupt service routine corresponding to the interrupt received by interrupt control unit 14, transfers data out of the buffer. In one embodiment, interrupt control unit 14 receives up to six interrupt request lines from external devices and six internal interrupt request lines (three from timer control unit 18, two from DMA control unit 20, and one from asynchronous serial port 24). Interrupt control unit 14 prioritizes the interrupts and presents the interrupts to processor core 16 one at a time. Additionally, individual interrupt requests may be programmably masked according to a user's needs.

Timer control unit 18 includes a plurality of programmable timers. The timers may be used to time certain events. Additionally, one of the timers may be used as a "watchdog-timer". A "watchdog timer" is initialized by a software instruction just prior to performing an instruction or instructions which may result in an infinite hang condition (e.g. infinite loop, an instruction which never completes executing because data is never returned from an external device, etc.). The watchdog timer provides an interrupt after counting down, causing the processor core 16 to exit from the instruction code which is experiencing the infinite hang condition. The microcontroller may then proceed with other tasks.

DMA control unit 20 is configured to perform direct memory access (DMA) transfers between memory and I/O spaces or from two address ranges within one or the other of the memory and I/O spaces. Generally, DMA control unit 20 is programmed with source and destination addresses and a transfer count defining the number of bytes (or words) to be transferred from the source to the destination. DMA control unit 20 then performs the indicated transfer. In one embodiment, DMA control unit 20 includes two DMA channels for programming two different DMA transfers.

Generally speaking, a DMA transfer is a transfer of data from a source location or locations to a destination location or locations performed without intervention by processor core 16. The transfer is performed via a "channel" within the DMA control unit 20 (or DMA controller). The channel provides the communication between the source and destination locations. Generally, DMA control unit 20 reads the source locations, capturing the data therefrom, and stores the data into the destination locations. Each channel is separately configurable and independent of the other. Therefore, the channels may operate in parallel, sharing internal bussing 34. Additionally, two DMA transfers may be initialized by processor core 16 concurrently, and the DMA transfers may occur in any order depending upon the needs of the devices involved in the transfers.

DMA transfers may be unsynchronized, source synchronized, or destination synchronized. Unsynchronized DMA transfers begin when the control register of the channel providing the transfer is updated by processor core 16 with a value indicating the transfer is programmed and that the transfer is unsynchronized. Source-synchronized transfers wait for a request signal to be asserted from the source of the DMA transfer before beginning the transfer. Finally, destination-synchronized DMA transfers wait for a request signal to be asserted from the destination of the DMA transfer before beginning the transfer. While unsynchronized and source-synchronized DMA transfers perform continuous accesses of the source and destination storage locations (once the transfer is initiated), destination-synchronized DMA transfers include a pause between updating a destination location and accessing the next source location. If the destination device removes its request during the pause, then the request must be asserted again to continue the transfer. The pause is 2 bus cycles long, in one embodiment.

PIO unit 22 allows programming of a set of programmable input/output (PIO) pins. A user may choose to program each individual pin as in input or output pin. The pin may be employed for any purpose according to a user's needs. Values conveyed on an output pin or received from an input pin are stored in respective locations of a register which is accessible to the user via an instruction. Additionally, configuration registers are includes for enabling PIO pins and for configuring PIO pins as input or output.

Asynchronous serial port 24 provides an asynchronous serial communication mechanism compatible with industry standard RS232 specifications. On the other hand, synchronous serial interface 26 provides a synchronous communications mechanism via a synchronous serial interface including a clock pin, a data pin, and a pair of enable pins. The data pin and pair of enable pins are referenced to the clock pin.

Chip select unit 28 provides a set of external chip select signals for a variety of peripheral devices based upon a programmable memory map. Each external chip select signal is assigned to a block of memory (i.e. a contiguous range of addresses) within the addressable memory provided by microcontroller 10 (i.e. the address space). Each external chip select signal is received by a particular peripheral device, and an assertion of that external chip select signal informs the particular peripheral device that the address being presented is within that peripheral device's address space (i.e. within its assigned memory block). In one embodiment, 20 bits of address are employed, providing a 1 Mbyte address space. Each external chip select is programmed to respond to a specific range of addresses within the 1 Mbyte address space. The ranges of addresses to which the external chip selects respond do not include the range of addresses assigned to internal memory 30. In one embodiment, up to 12 external chip selects are included in accordance with 80C186 compatibility.

Figure 2:
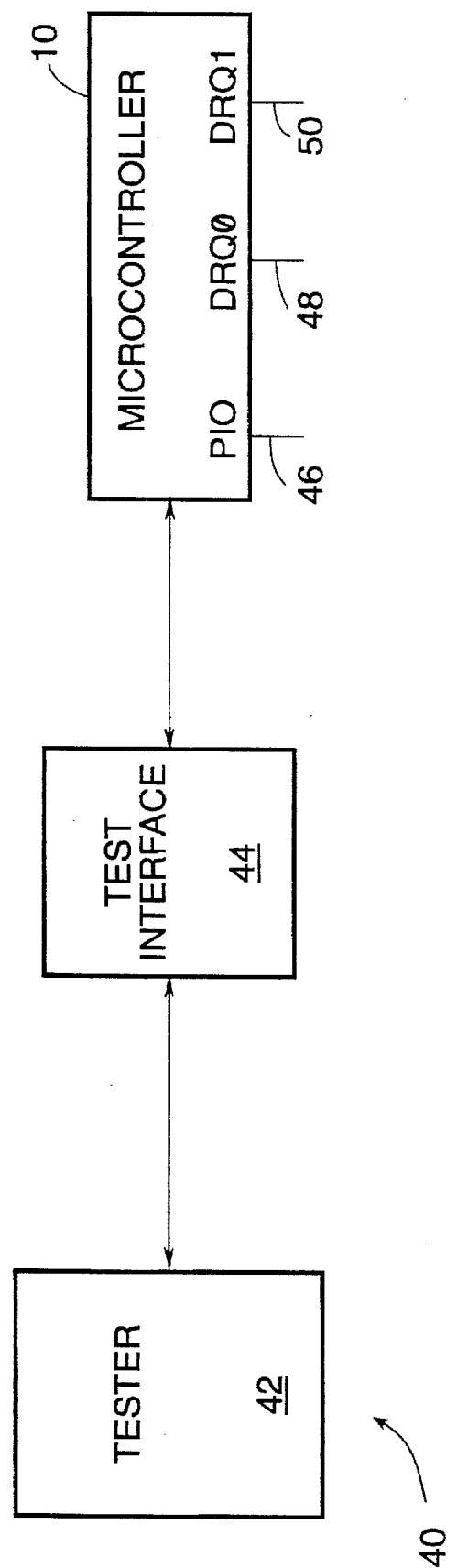
FIG. 2 is a block diagram of a tester system configured to test the microcontroller shown in FIG. 1.

Turning now to FIG. 2, a block diagram of a tester system 40 configured to test microcontroller 10 is shown. Tester system 40 includes a tester 42, a test interface 44, and microcontroller 10. Tester 42 may be any semiconductor test machine. For example, tester 42 may be a J971 tester obtainable from Teradyne, Inc. of Boston, Mass. Additionally, test interface 44 may be obtained from Teradyne as well. Typically, tester 42 and test interface 44 are sold together as a unit. Test interface 44 is used to contact with microcontroller 10, and is generally customized for each integrated circuit which tester 42 is used to test. For example, packaged parts are tested using a device interface board (DIB) within test interface 44. The DIB has a standard interface to the remainder of test interface 44 and a customized interface to microcontroller 10 such that each pin is of microcontroller 10 is contacted simultaneously.

Generally speaking, tester 42 is configured to apply a set of test vectors to microcontroller 10. Each test vector represents a clock cycle (i.e. one period of the clocking signals generated by clock control/power management unit 12). The test vector supplies a value for each input pin and for each input/output pin which is in input mode during the clock cycle. Additionally, the test vector supplies an expected value for each output pin and for each input/output pin which is in output mode during the clock cycle. Tester 42, through test interface 44, supplies the input values upon the input pins during the corresponding clock cycle and checks the output values upon the output pins during the corresponding clock cycle for each test vector in the set provided.

The test vectors are generally created by the designers of microcontroller 10. Test vectors may be created to exercise critical paths (i.e. logic paths which take the longest amount of time to calculate a result). Other sets of test vectors generally check functionality of the cores of microcontroller 10 (these sets of test vectors are often referred to as "functional patterns").

In the embodiment shown, sets of test vectors are created to perform defect testing upon internal memory 30 (i.e. BIST). The test vectors comprise feeding instructions to processor core 16 via external bus 36. These instructions initialize configuration registers within processor core 16, initialize DMA controller 10, and initiate the DMA transfers by asserting a PIO pin coupled to the DMA request pins. As shown in FIG. 2, a PIO pin 46 is and DMA request pins 48 and 50 are included in microcontroller 10. During the simulation performed to create the test vectors (as described below) PIO pin 46 is coupled to DMA request pins 48 and 50 in order to provide assertion of the DMA request pins 48 and 50. However, during conversion to the test vectors, DMA request pins 48 and 50 are identified as input pins. The tester drives the input pins to the appropriate value provided by the simulation (via PIO pin 46). The test vectors for testing internal memory 30 further comprise a set of expectation vectors for the DMA transfers. The expectation vectors verify that the results of reading and writing internal memory 30 are correct (i.e. that no defects are detected).

Figure 3:
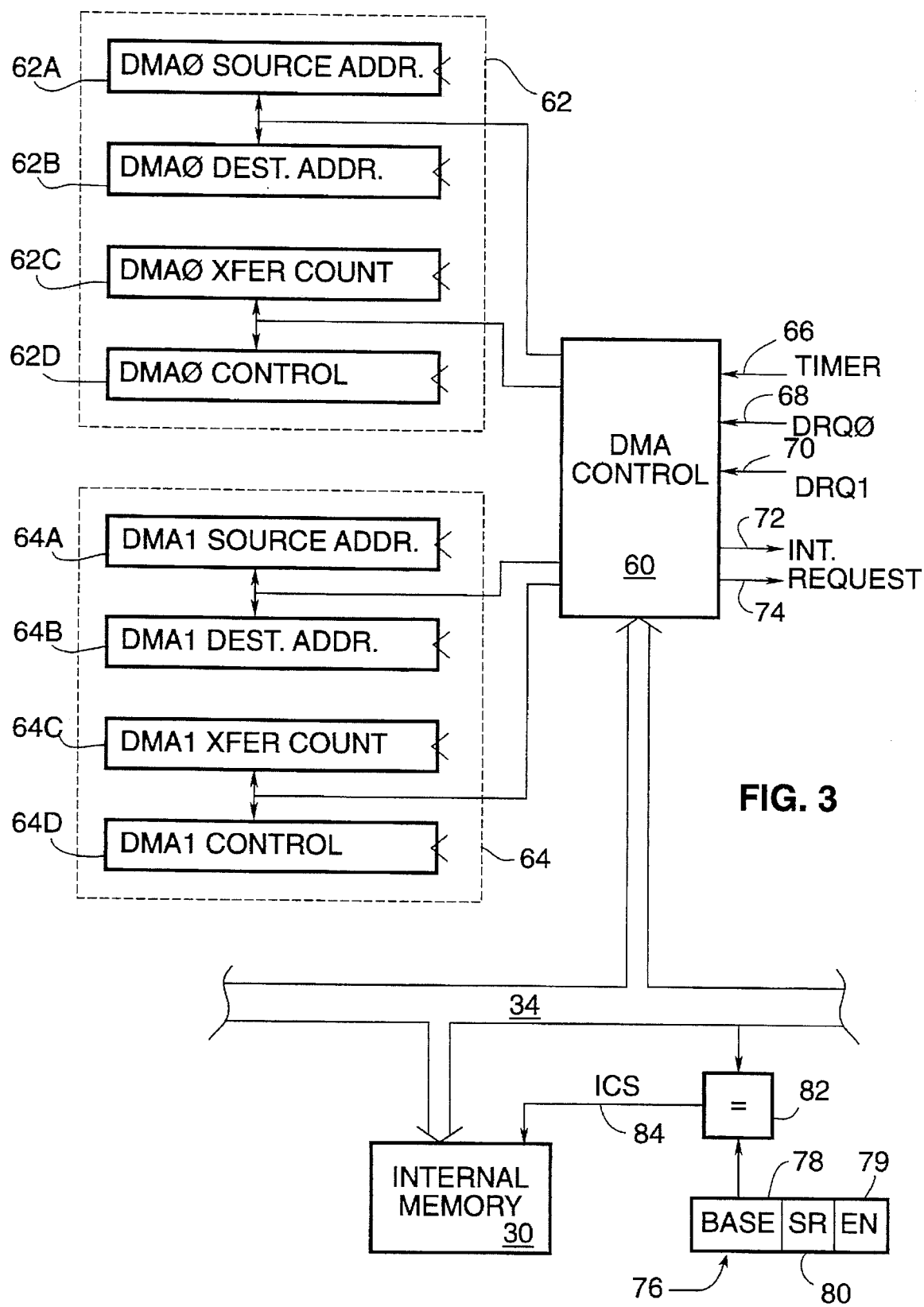
FIG. 3 is a block diagram of a DMA controller and a memory integrated into the microcontroller shown in FIG. 1.

Turning now to FIG. 3, a diagram depicting one embodiment of DMA control unit 20 and internal memory 30 in greater detail is shown. Other embodiments are contemplated. As shown in FIG. 3, DMA control unit 20 includes a DMA control block 60, a set of first DMA channel registers 62, and a set of second DMA channel registers 64. DMA control block 60 is coupled to first DMA channel registers 62, second DMA channel registers 64, and internal bussing 34. Additionally, DMA control block 60 receives a timer line 66 from timer control unit 18, a DRQ0 line 68 coupled to DMA request pin 48, and a DRQ1 line 70 coupled to DMA request pin 50. Finally, DMA control block 60 provides interrupt request lines 72 and 74 to interrupt control unit 14. Interrupt request line 72 corresponds to the first DMA channel and interrupt request line 74 corresponds to the second DMA channel.

FIG. 3 further depicts internal memory 30 along with an internal memory configuration register 76. Internal memory configuration register 76 comprises a base field 78, an enable bit 79, and a show read bit 80 as shown in FIG. 3. Additional configuration bits may be provided as well. Enable bit 79 is used to enable/disable internal memory 30. Base field 78 stores an indication of the base address of internal memory 30 within the address space of microcontroller 30. The base address is the address of the least significant storage location within internal memory 30. Other storage locations within internal memory 30 are located via addresses having a greater numerical value than the base address stored in base field 78. For the present embodiment, the base address is required to be aligned to an address boundary for the size of internal memory 30 within the address space of microcontroller 10. For example, according to one embodiment the address space of microcontroller 10 is characterized by 20 address bits (i.e. a 1 Mbyte address space) and internal memory 30 comprises 32 kbytes of storage. Therefore, the base address of internal memory 30 is aligned to a 32 kilobyte boundary within the address space (i.e. the least significant 15 bits of the base address are zero). Base field 76 may be configured to store only the address bits which are not required to be zero (i.e. the most significant 5 bits in the present embodiment). Show read bit 80 defines the show read mode of microcontroller 10 in addition to a hardware pin which may be toggled at reset. If show read bit 80 is set, microcontroller 10 is in show read mode. If show read bit 80 is clear, microcontroller 10 is not in show read mode unless placed there by the assertion of the hardware pin at reset.

A comparator circuit 82 is coupled between base field 78 of internal memory configuration register 76 and the address portion of internal bussing 34. If an address presented upon internal bussing 34 is within the address space of internal memory 30, comparator circuit 32 asserts an internal chip select (ICS) signal upon an ICS line 84 to internal memory 30. Internal memory 30 is thereby informed to respond to the present access by providing read data (read access) or storing the data provided (write access). For example, if DMA control block 60 performs a read or write access to internal memory 30 during a DMA transfer, the ICS signal asserted.

Generally speaking, DMA control block 60 performs read and write accesses upon internal bussing 34 in order to complete a DMA transfer specified by the first or second DMA channels. Bus interface unit 32 drives the bus cycles externally. Each data item being transferred by the DMA transfer requires a read access to the source and a write access to the destination. The source address may be incremented or decremented after each access to point to the next consecutive data item in the DMA transfer. Similarly, the destination address may be incremented or decremented. Alternatively, either the source address or the destination address (or both) may remain constant during the transfer. A "data item" is one item of data being transferred. In the present embodiment, data items may be bytes or words. The size of the data items for a given DMA transfer are specified in the control register of the channel performing the transfer. Furthermore, DMA control block 60 decrements the transfer count for the channel upon performance of each read/write access pair. Upon exhaustion of the transfer count, the DMA transfer ends unless the control register indicates otherwise. An interrupt may be generated upon interrupt request lines 72 or 74 upon completion of the DMA transfer.

DMA control block 60 resolves priority between the DMA channels if the DMA transfers are performed during overlapping periods of time. Values in the control register for each DMA transfer help to resolve the priority (i.e. a higher priority channel is performed first). If DMA transfers are assigned equal priority, the read/write access pairs of the two transfers are interleaved. The second DMA channel is defaulted to higher priority to determine the first read/write access pair to be performed when both channels are assigned the same priority level, after which interleaving of the read/write access pairs is performed (i.e. a read/write access pair from the second DMA channel is performed, then a read/write access pair from the first DMA channel, etc.). A read/write access pair of the read access from the source to obtain a particular value and the corresponding write access to the destination, updating the destination with the particular value.

In the present embodiment, in which microcontroller 10 is 80C186 compatible, each data item requires at least 8 clock cycles to transfer. Four clock cycles are used for the read access, and four clock cycles for the write access. If either the source or the destination requires wait states, the number of cycle per access increases. Furthermore, additional cycles are incurred if a DMA transfer is destination-synchronized.

DMA control block 60 updates first DMA channel registers 62 and second DMA channel register 64 in response to write accesses to the registers upon internal bussing 34; and further provides register contents in response to read accesses thereto. First DMA channel registers 62 define the first DMA channel, and second DMA channel registers 64 define the second DMA channel. First DMA channel registers 62 comprise a first DMA source address register 62A, a first DMA destination address register 62B, a first DMA transfer count register 62C, and a first DMA control register 62D. Similarly, second DMA channel registers 64 comprise a second DMA source address register 64A, a second DMA destination address register 64B, a second DMA transfer count register 64C, and a second DMA control register 64D. Each of first DMA channel registers 62 and second DMA channel registers 64 are assigned an address to which read and write accesses are performed in order to read and write the corresponding registers.

The source address register and destination address register of a channel define the address presented during the read access and the write access of a data item within the DMA transfer, respectively. Subsequent to each access, the corresponding address is incremented, decremented, or unmodified depending upon the value in the corresponding control register. The transfer count register stores the number of data items to be transferred.

The control register of the channel specifies details of the DMA transfer to be performed. More particularly, the control register specifies: (i) the synchronization mode of the transfer (i.e. unsynchronized, source-synchronized, or destination-synchronized); (ii) the data item size (i.e. byte or word); (iii) whether or not to generate an interrupt at the conclusion of the DMA transfer; (iv) whether or not the DMA transfer concludes at the exhaustion of the transfer count; (v) priority level of the DMA channel (high or low); (vi) whether to increment, decrement, or not modify the source address after each read/write access pair; (vii) whether the source address is in memory or I/O space; (viii) whether to increment, decrement, or not modify the destination address after each read/write access pair; and (ix) whether the source address is in memory or I/O space.

If the synchronization mode of a given DMA transfer is unsynchronized, the DMA transfer is initiated by DMA control block 60 upon update of the corresponding control register. If the synchronization mode is source or destination synchronized, then DMA control block 60 initiates the DMA transfer upon assertion of the corresponding DMA request signal (DRQ0 line 68 for the first DMA channel and DRQ1 line 70 for the second DMA channel). Alternatively, timer line 66 may be used as a request line for the channels.

Figure 4:
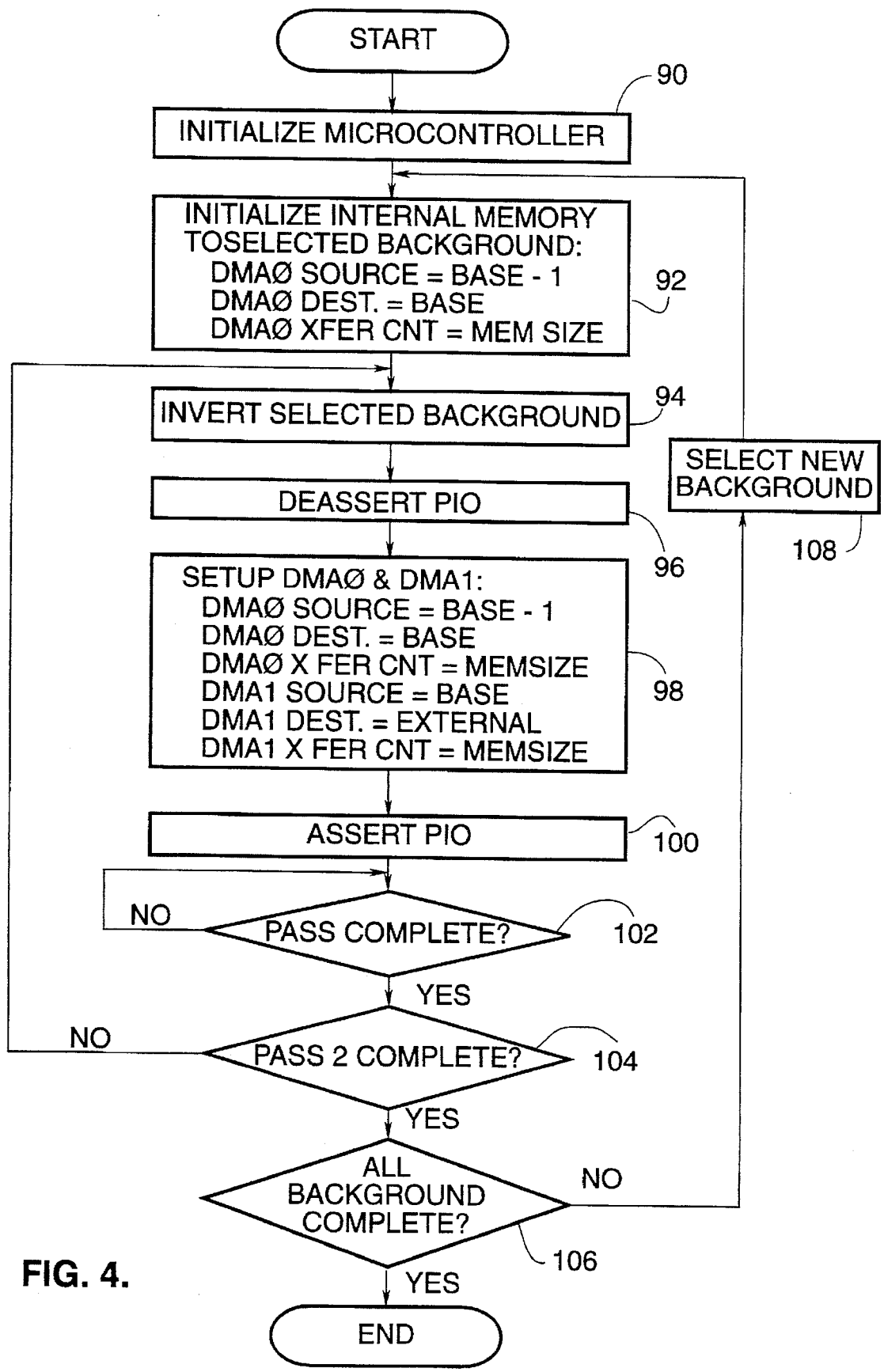
FIG. 4 is a flowchart depicting activities performed by the DMA controller shown in FIG. 3 to test the memory shown in FIG. 3.

Turning now to FIG. 4, a flowchart representing the activities performed to test internal memory 30 using DMA controller 20 to perform BIST operations is shown in accordance with the present embodiment. Other sets of activities may be performed as well as long as the reading and writing of background patterns and complements of the background patterns are performed to satisfy defect testing criteria.

The test begins upon reset of microcontroller 10. Therefore, microcontroller 10 is initialized with the conditions used to conduct the test (step 90). In particular, certain of the chip selects are assigned to address ranges within the address space of microcontroller 10. Internal memory configuration register 76 is provided with a value, thereby programming the base address of internal memory 30. In one embodiment, show read mode is enabled as well. In this manner, the read portion of DMA transfers, when directed to internal memory 30, are visible upon the pins of the microcontroller 10 for verification. A first chip select is programmed for the address range immediately below the internal memory range (an address range is below another address range if the address range contains addresses which are numerically less than the addresses within the other address range). The address which is consecutive to the base address of internal memory 30 and below the base address is used to store the background pattern selected for the test, and therefore the first chip select is defined for this memory range. Additionally, a second chip select is defined for the memory range containing the address external to internal memory 30 which is the destination used by the first DMA channel during the test (as described below). The memory location consecutive to and below the base address (the "background pattern location") is initialized to the selected background pattern for the test. Finally, PIO pin 46 is enabled as an output pin by setting the appropriate control registers.

After initializing microcontroller 10, the first DMA channel of DMA control unit 20 is used to initialize internal memory 30 to the selected background pattern (step 92). The source address is programmed to the background pattern location; and the destination address is programmed to the base address of internal memory 30. The transfer count is set to the number of words stored in internal memory 30. Furthermore, the DMA transfer is performed unsynchronized, with increment of the destination address, source address remaining constant, and word-sized data items. Both source and destination addresses are identified as memory space addresses. Therefore, the selected background pattern is repeatedly read from the background pattern location and stored into the various memory locations of internal memory 30.

After completing initialization of internal memory 30, the background pattern stored in the background pattern location is replaced by its complement (step 94). Complementing the selected background pattern provides the complemented background pattern for the second DMA channel to access, as described below.

As mentioned above, a PIO pin is used to synchronize initiation of the two DMA transfers which operate concurrently to perform each pass of the test during simulation of the test on a software model of microcontroller 10. Therefore, the PIO pin is deasserted prior to configuring the two DMA channels (step 96). Deasserting the PIO pin comprises setting the control register corresponding to the data for the PIO pin to a deasserted state. It is noted that, generally, step 96 comprises deasserting the DMA request pins 48 and 50 using any method.

The first and second DMA channels are configured for the test pass after deasserting the PIO pin (step 98). The first DMA channel is initialized to a source address of the background pattern location, a destination address of the base address of internal memory 30, and a transfer count of the number of words within internal memory 30. The second DMA channel is initialized to a source address of the base address of internal memory 30, a destination address of the external address used to verify the contents of internal memory 30, and a transfer count of the number of words within internal memory 30. Additionally, both control registers are initialized to source-synchronized, increment of source address, all addresses in memory space, and high priority level. The first DMA channel is set to increment the destination address as well, while the second DMA channel is set to hold the destination address constant.

The second DMA channel is used to read the background pattern currently stored in each memory location and store that pattern to the destination address. Therefore, the second DMA transfer verifies that the background pattern can be stored into and read from each memory location within internal memory 30. Furthermore, since the accesses of the first and second DMA transfers are interleaved, the second DMA transfer verifies that the values remain constant when neighboring locations are updated to the complement of the background pattern.

The first DMA channel is used to update each memory location with the complement of the background pattern and to verify the update. The first DMA transfer accomplishes the verification by first reading the background pattern location (which is storing the complement of the background pattern via step 96) and storing this value into the least significant storage location of internal memory 30 (i.e. the storage location identified by the base address of internal memory 30). During the succeeding read/write pair of the first DMA transfer, the least significant storage location is accessed (thereby verifying the update), and the second least significant storage location (i.e. the base address plus one word) is updated with the accessed value.

Figure 5:
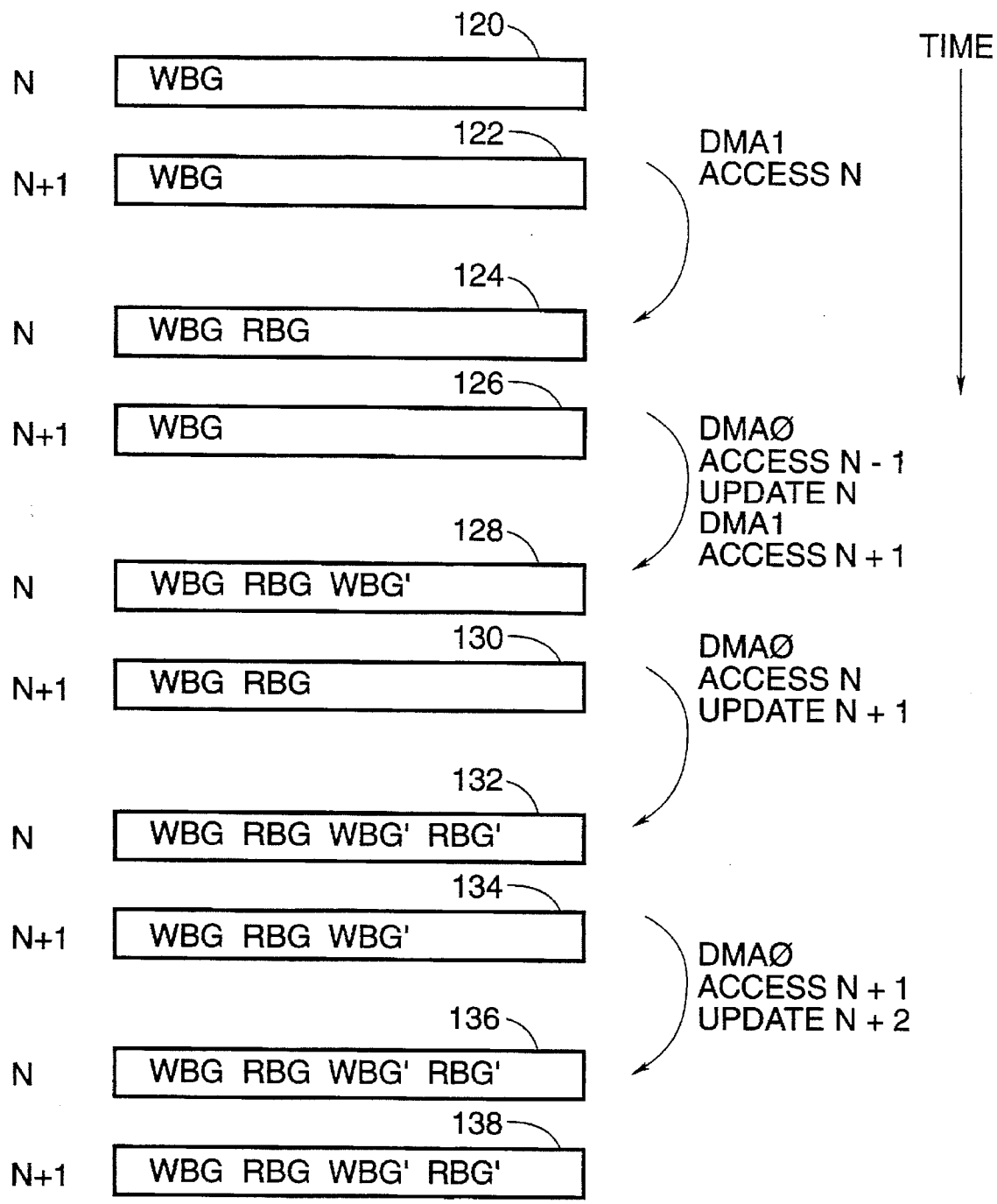
FIG. 5 is a diagram depicting values in a pair of consecutive storage locations of the memory shown in FIG. 3 at various points in an interval of time in which the DMA controller is performing the activities shown in FIG. 4.
Figure 5A:
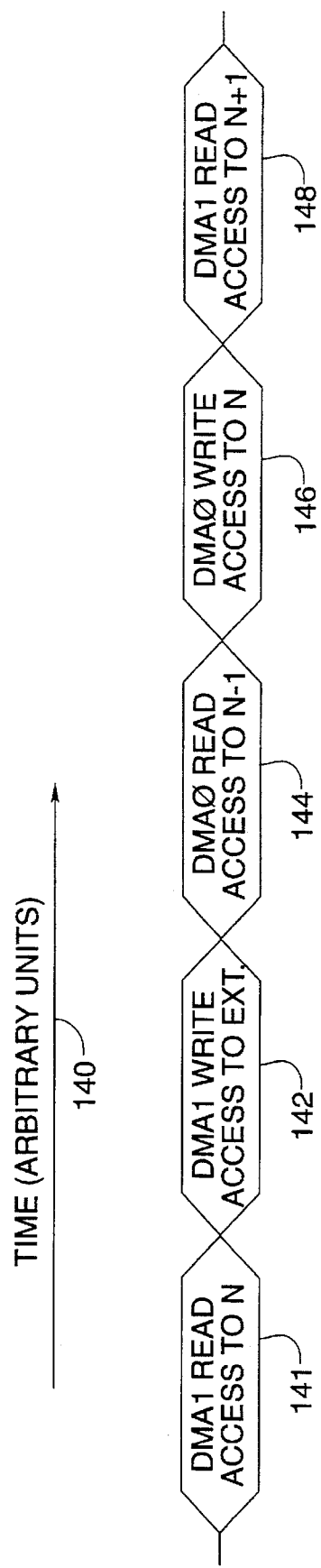
FIG. 5A is a timing diagram depicting several bus transactions in accordance with the flowchart of FIG. 4.

After completing initialization of the DMA channels, PIO pin 46 is asserted by storing a value representing an asserted condition into the control register representing the data of PIO pin 46 (step 100). DMA request pins 48 and 50 are thereby asserted in the simulation, and DRQ0 lines 68 and 70 are received in an asserted condition by DMA control block 60. As noted above, the DMA channels are programmed to equal priority levels. Since the requests are received concurrently and the priority levels are the same, DMA control block 60 defaults to starting the second DMA channel first and then alternating the first DMA channel and the second DMA channel. Therefore, each memory location is read by the second DMA transfer, then updated by the first DMA transfer, then read by the first DMA transfer. FIGS. 5 and 5A below depict the interleaving of accesses in greater detail. It is noted that step 100 provides concurrent request of both DMA channels. Any method for concurrently asserting signals upon DMA request pins 48 and 50 may be employed.

It is noted that in the present embodiment, steps 90-100 are performed by passing instructions from the pins of microcontroller 10 into processor core 16. The instructions are executed to perform the activities of initializing microcontroller 10, configuring DMA control unit 20, asserting and deassertion PIO pin 46, and inverting the selected background pattern.

The test awaits completion of the DMA transfers (decision block 102). Since, in the embodiment of microcontroller 10, DMA activity is higher priority than requests from processor core 16, instructions are not needed to perform decision block 102. Instead, several NOP instructions may be inserted in the instruction code sequence to occupy processor core 16 until the DMA activity begins. Then, processor core 16 is automatically locked out until the DMA activity completes. In embodiments were processor core 16 is not automatically locked out of bus activity, other solutions may be applied. For example, the DMA controllers may be configured to interrupt processor core 16 upon completion. In such a situation, processor core 16 may be placed into an infinite loop to perform decision block 102. Upon completion of the DMA transfers, the interrupt allows processor core 16 to proceed to the subsequent steps.

Upon completion of the DMA activity, decision block 104 is performed. At completion of the DMA activity for the first pass corresponding to a selected background pattern, internal memory 30 has been converted from storing the selected background pattern (initialized therein via step 92 and the subsequent DMA transfer) to storing the complement of the selected background pattern (stored therein via the first DMA channel as programmed in step 98). A second pass is then performed through steps 94-102, converting internal memory 30 from storing the complement of the selected background pattern to the selected background pattern. Decision block 104 indicates whether or not a second pass has been performed for the selected background pattern. If a second pass is still to be performed, steps 94-102 are repeated. If a second pass has been completed, decision block 106 is performed.

At decision block 106, the test determines if all the backgrounds specified for testing internal memory 30 have been performed. In one embodiment, five background patterns are used to perform a complete BIST of internal memory 30. The value are (listed as hexadecimal words): 0000, 3333, 5555, 00ff, and 0f0f. If all patterns have been performed, the test ends. If patterns remain to be performed, a new pattern is selected (step 108) and steps 92-106 are repeated for the new pattern.

It is noted that test vectors are generated for the flow chart shown in FIG. 4, and the test vectors are applied to microcontroller 10. The instructions used to perform steps 90-100 are thereby provided to microcontroller 10 as test vector inputs. Additionally, the correct operation of the DMA transfers (i.e. verification that the data is as expected) is verified by test vector expected outputs which correspond to proper operation of the DMA transfer. If a memory location is defective, the tester notes the difference between the expected value and the actual value.

It is noted that both passes through steps 94-102 of the flowchart are performed by incrementing through the addresses of internal memory 30 with the first and second DMA transfers of step 98. However, embodiments are contemplated in which incrementing and decrementing through the addresses are performed in various passes. For example, addresses may be incremented during the first pass for a selected pattern and decremented during the second pass (i.e. proceeding form the most significant memory location of internal memory 30 to the least significant memory location).

Turning now to FIG. 5, a diagram depicting a pair of consecutive memory locations within internal memory 30

(N and N+1) during various points of the time interval in which the test represented by the flowchart shown in FIG. 4 is being performed. Indicated within the memory locations are the read and write activities that have been performed to that memory location. The first letter of the activity identifies read ("R") or write ("W"). The remaining two letters and apostrophe or lack thereof indicate the value read or written. Either the selected background pattern ("BG") or the complement of the selected background pattern ("BG'") is read or written. Additionally, the activities are listed within each location in chronological order of their performance.

Reference numbers 120 and 122 depict memory locations N and N+1 after initialization to the selected background pattern. Therefore, each location has been written to the selected background pattern (WBG). Reference numbers 124 and 126 represent memory locations N and N+1 (respectively) after the first DMA channel has accessed memory location N. Therefore, the selected background pattern has been read from memory location N (RBG). Reference numbers 128 and 130 depict memory locations N and N+1 (respectively) after the first DMA channel has updated location N with the complemented background pattern (WBG') and the second DMA channel has accessed location N+1 (RBG). Similarly, reference numbers 132 and 134 represent memory locations N and N+1 after the first DMA channel has accessed location N and update location N+1; and reference numbers 136 and 138 represent memory locations N and N+1 after the first DMA channel has accessed location N+1.

As FIG. 5 illustrates, the first DMA channel follows the second DMA channel through the memory locations of internal memory 30. Upon completion of the DMA initialization corresponding to step 92 and one set of DMA transfers corresponding to step 98 of the flowchart shown in FIG. 4, each storage location has been written to a background pattern (WBG), the background pattern has been read for verification (RBG), the complement of the background pattern has been written (WBG') and the complement of the background pattern has been read for verification (RBG'). Additionally, due to the interleaving of the DMA transfers, adjacent memory locations to the memory location being read for verification of the selected background pattern have been updated to the complement of the selected background pattern (e.g. reference numbers 128 and 130 wherein memory location N receives WBG' prior to memory location N+1 receiving RBG).

Turning now to FIG. 5A, a set of read and write accesses as the accesses may appear in chronological order upon internal bussing 34 and/or external bus 36 during the DMA transfers programmed in step 98 is shown. Other orders are contemplated. FIG. 5A further illustrates the interleaving of DMA transfers depicted in FIG. 5. An arrow 140 indicates the positive progression of time, in arbitrary units.

As shown in FIG. 5A, the second DMA channel performs a read access 141 to a memory location "N" followed by a write access 142 to the external address. The background pattern is thereby verified for location N. Subsequently, the first DMA channel performs a read access 144 to location N−1 (i.e. the location adjacent to location N having a numerically smaller address than location N) followed by a write access 146 to location N. Location N is thereby updated to the complement of the background pattern (stored into location N−1 by a preceding read/write pair from the first DMA channel, not shown in FIG. 5A). Subsequently, a read access 148 by the second DMA channel is performed to location N+1. Location N+1 is therefore read for verification of the background pattern subsequent to updating adjacent location N to the complement of the background pattern).

It is noted that other orders of the accesses shown in FIG. 5A are contemplated, as long as the second DMA channel accesses a location N prior to update of that location by the first DMA channel. For example, write access 142 and read access 144 can be swapped in order.

Figure 6:
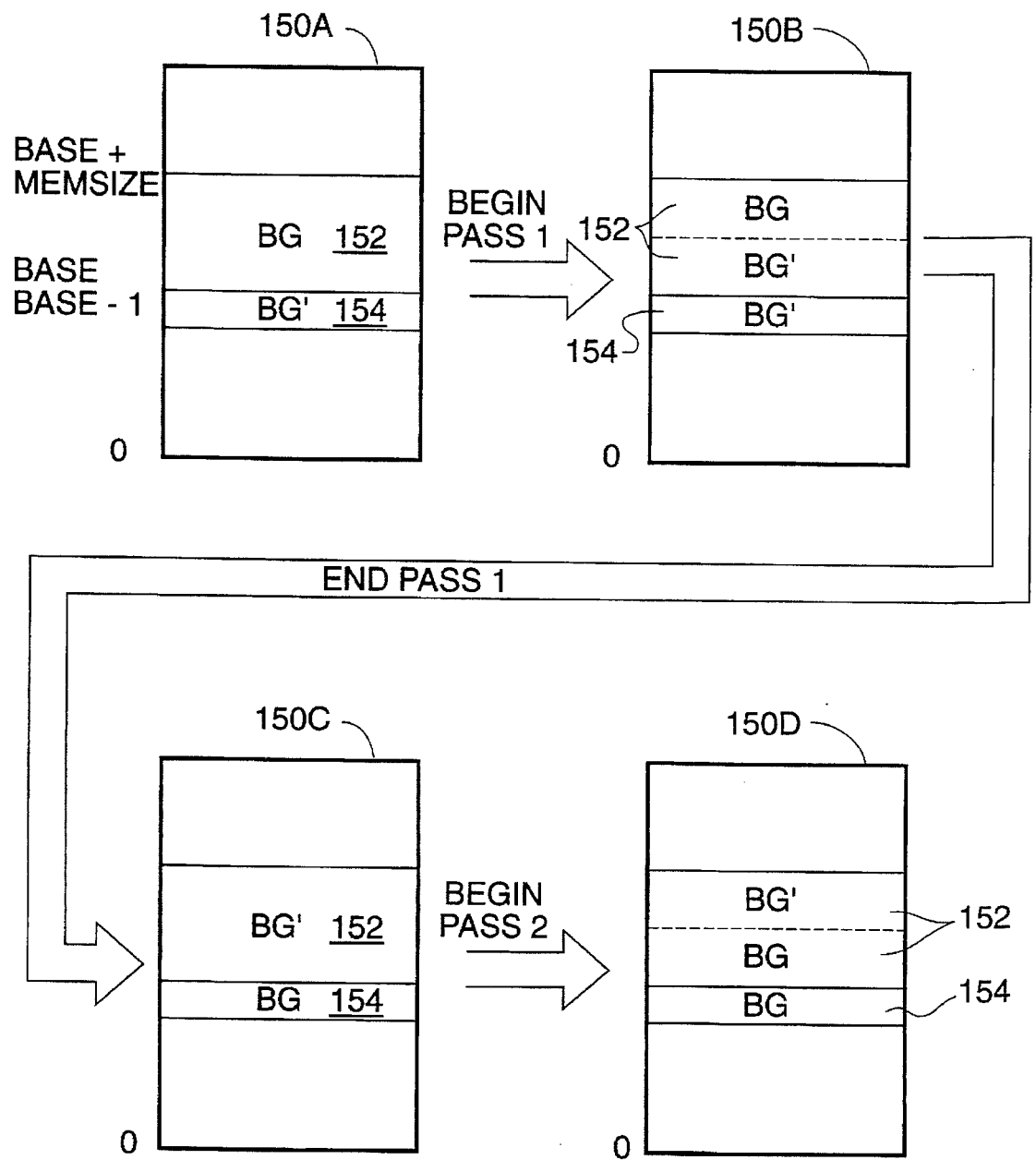
FIG. 6 is a diagram depicting the state of various storage locations including the storage locations of the memory shown in FIG. 3 at various points in the interval of time in which the DMA controller is performing the activities shown in FIG. 4.

Turning next to FIG. 6, a diagram illustrating the address space of microcontroller 10 at various points during the progression of the two passes shown in FIG. 4 for a particular selected background is shown. Address spaces 150A, 150B, 150C, and 150D are shown, each depicting the state of memory at various points during the execution of the two test passes. The least significant address (address "0") is depicted at the bottom of each address space 150, and the most significant address at the top of each address space 150. Each address space 150 includes a first region 152 corresponding to internal memory 30 (e.g. between the base address and the base address plus the size of internal memory 30) and a second region 154 corresponding to the memory location consecutive to and below the storage location identified by the base address (i.e. the background pattern location). The symbol "BG" indicates a memory location or locations storing the selected background pattern for the test. The symbol "BG'" indicates a memory location or locations storing the complement of the selected background pattern.

Address space 150A depicts the state of memory after initializing internal memory 30 but prior to beginning the first pass of the test. Therefore, region 152 contains the selected background pattern and region 154 contains the complement of the selected background pattern. Address space 150B depicts the state of memory during the first pass of the test for the selected background pattern. A portion of region 152 is converted to storing the complement of the background pattern, and the remaining portion continues to store the background pattern. Address space 150C depicts the state of memory upon completion of the first pass but prior to initiation of the second pass of DMA transfers. Region 152 is completely converted to the complement of the background pattern. Additionally, via step 94 of the second pass, region 154 stores the selected background pattern. Address space 150D depicts the state of memory during the operation of the second pass. A portion of region 152 is converted back to the selected background pattern, while a second portion still stores the complement of the selected background pattern. Upon completion of the second pass, region 152 will again store the selected background pattern in each memory location. It is noted that FIG. 6 depicts the state of memory if internal memory 30 includes no defects. If a defect is included, then the state of memory shown in address spaces 150A-150D may vary from that shown in FIG. 6. However, the tester will then detect the error and fail the test.

As FIGS. 5, 5A, and 6 illustrate, the algorithm employed within the first and second DMA transfer accomplishes the goals of the 13N test algorithm. In particular, the algorithm achieves the following verification of the memory cells: Each memory cell can be read and written with the background pattern and the complement of the background pattern while each of the other memory cells is storing either the background pattern or the complement of the background pattern.

Figure 7:
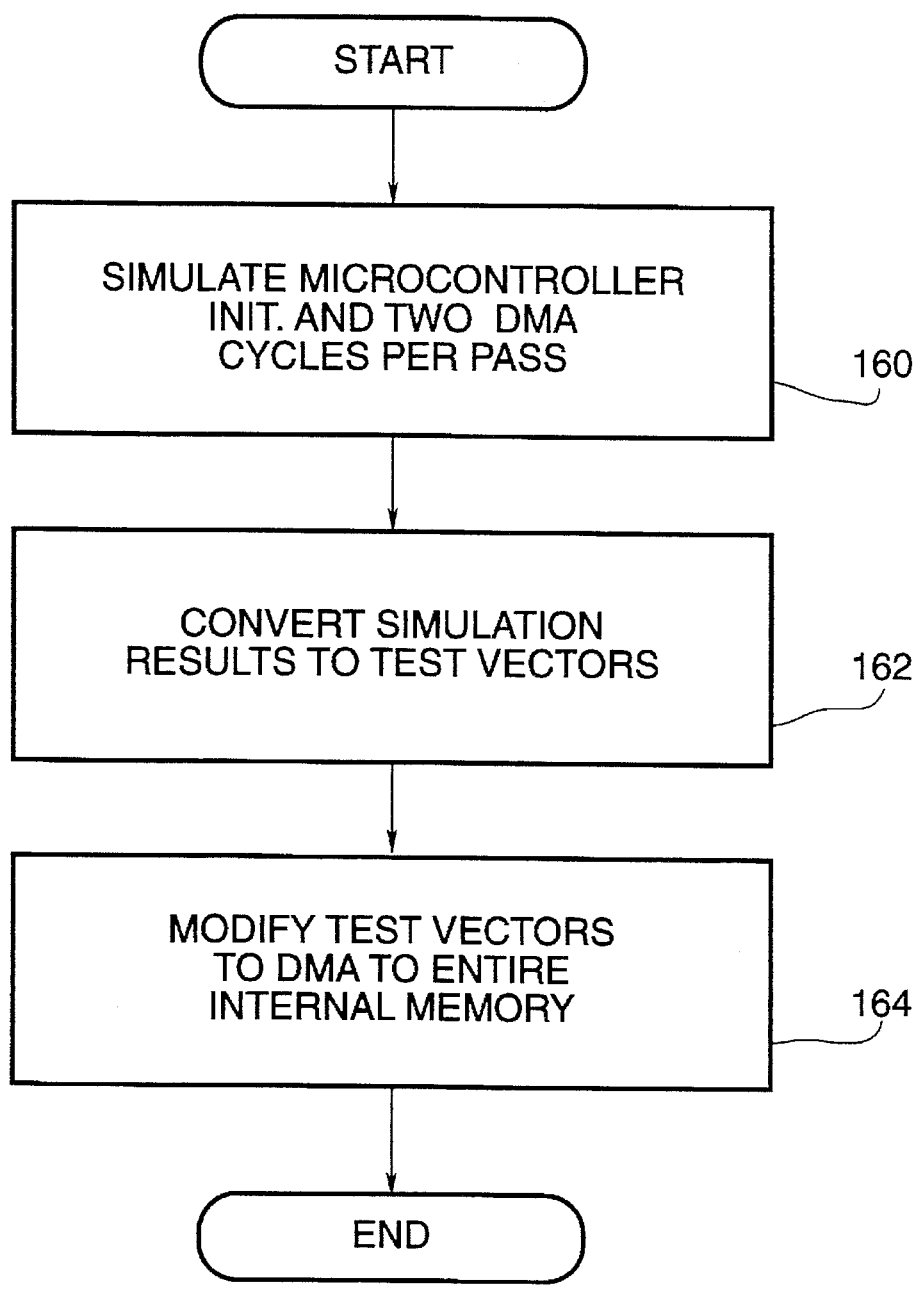
FIG. 7 is a flowchart depicting activities performed to generate a set of test vectors corresponding to the flowchart shown in FIG. 4.

Turning now to FIG. 7, a flowchart is shown depicting the process of forming test vectors for the test depicted by the flowchart shown in FIG. 4. Generally, test vectors can be created by simulating the test upon a software model of microcontroller 10, capturing the simulation results, and converting the results to test vectors. The software model of microcontroller 10 produces the expected results, and a correctly functioning manufactured microcontroller 10 produces the same results. The simulation results captured comprise the values upon each of the pins of microcontroller 10 during each clock cycle of the simulation. These values can then be converted to test vectors with a knowledge of which pins are inputs and which pins are outputs during the clock cycle.

Unfortunately, simulating the DMA transfers to the entire internal memory 30 may require a large amount of simulation time. For example, in the present embodiment a 32 kilobyte internal memory 30 is employed and each read/write pair of the DMA transfers uses 8 cycles. A 32 kilobyte internal memory 30 includes 16 k words, if words are 2 bytes. The initialization pass through internal memory 30 is performed by one DMA channel, occupying (8*16 k) 128 k clock cycles. The first test pass through internal memory 30 is then performed using both channels for (2*8*16 k) 256 k clock cycles. Subsequently, the second test pass again uses both channels sweeping through internal memory 30 for (2*8*16 k) 256 k clock cycles. Therefore, testing one background pattern occupies a total of 640 k clock cycles. A small number of additional clock cycles are needed to initialize microcontroller 10. The simulation time for such a large number of clock cycles may be prohibitive. Furthermore, the number of test vectors may exceed the maximum number of test vectors which tester 42 is configured to store for a single test.

The flowchart shown in FIG. 7 is an alternative to simulating the entire DMA transfer. The flowchart takes advantage of the fact that, once the DMA transfers begin, the test becomes a repetitive pattern of read and write operations with the incremented addresses of the DMA transfers but the same data pattern being transferred. Instead of simulating the entire DMA transfer, then, only a small transfer count is programmed into each channel of the DMA transfer for the simulation (step 160). In the present embodiment, two read/write pairs are simulated for each DMA transfer. The simulation results for the small number of transfers are then converted to test vectors (step 162).

The test vectors created by step 162 are modified to represent the test desired to be performed upon the manufactured microcontroller 10 (step 164). Particularly, the following modifications are made:

(i) modify the instruction which updates the transfer count to provide a transfer count of the number of data items within internal memory 30 (e.g. 16 k in the present embodiment).

(ii) "don't care" the address pins during the DMA transfer, since these pins will be incremented in a fashion not reflected in the simulation. Because these pins are don't cared, the tester will not attempt to verify the state of the pins. No BIST test information is lost by don't caring the addresses, since the data verifies correct operation of internal memory 30.

(iii) "replicate" the test vectors corresponding to the DMA transfers until the number of DMA transfers actually performed in the test is reached (e.g. 16 k replications of one of the two read/write pairs for each DMA transfer in the present embodiment). Two read/write pairs are provided in the simulation to illustrate the repetitive pattern to be replicated.

It is noted that modification (iii) may be performed by having tester 42 loop on the set of test vectors corresponding to the DMA transfers. In other words, the same set of test vectors is repeatedly applied by the tester. In this manner, the number of test vectors is reduced while still performing the entire test.

Figure 8:
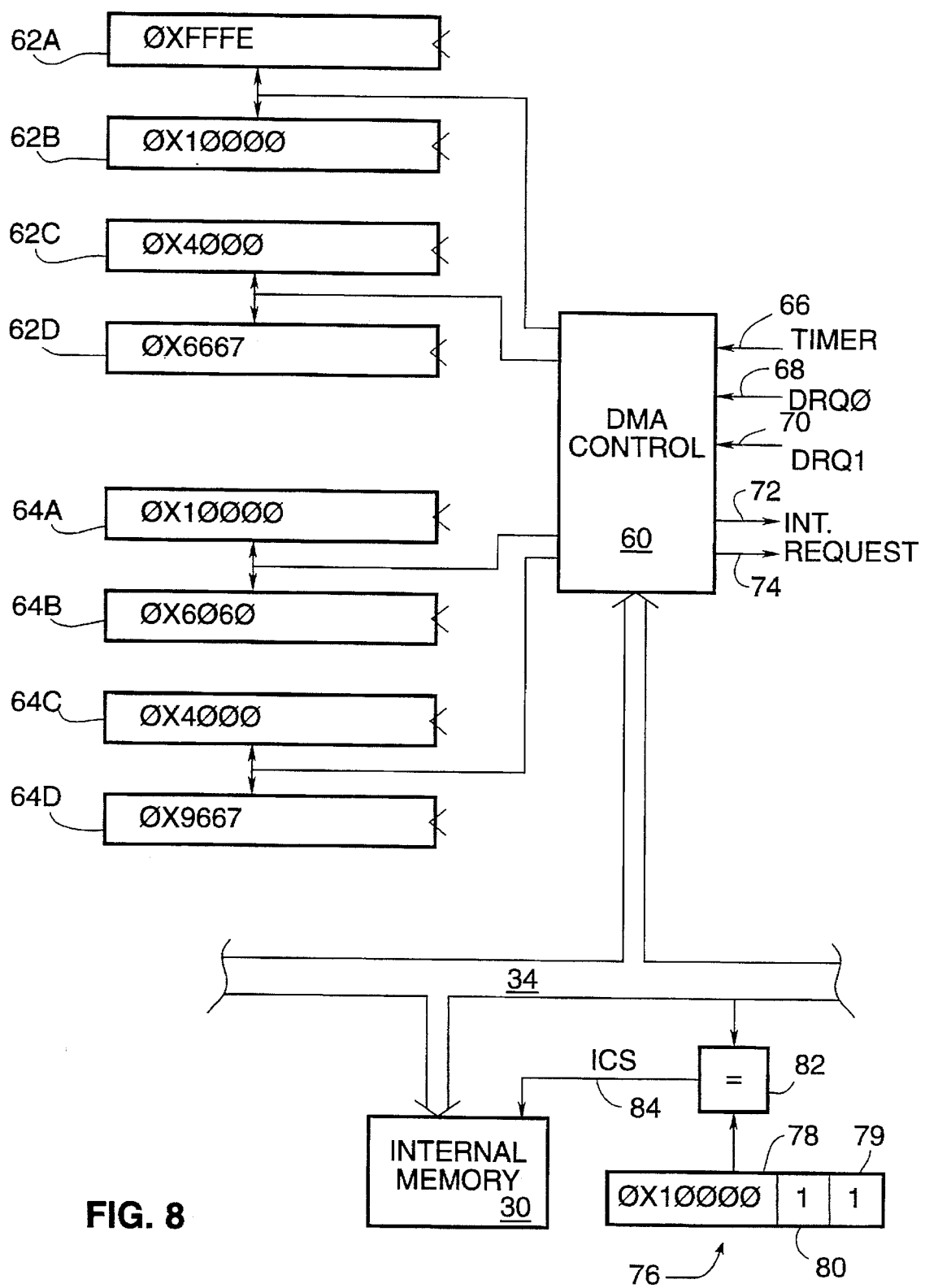
FIG. 8 is the block diagram of FIG. 3 with exemplary values programmed into the registers shown herein.

Turning next to FIG. 8, a block diagram similar to FIG. 3 is shown with the registers programmed for step 98 of the flowchart shown in FIG. 4 according to one exemplary test. The exemplary test is for an embodiment of microcontroller 10 which is 80C186 compatible, and more particularly is compatible with the AM186EM available from Advanced Micro Devices, Inc., of Sunnyvale, Calif. The instructions executed for the exemplary test depicted in FIG. 8 is included below for two passes of one selected pattern. The code may be extended to perform passes for all selected patterns by storing the patterns in memory and using a counter to select the patterns and loop through the code a number of times equal to the number of selected patterns. It is noted that the values shown in FIG. 8 which are preceded by "0x" are hexadecimal values, as such values are represented according to the notation of the "C" programming language.

The following code listing is the exemplary test corresponding to FIG. 8. The listing ends at the boldfaced term end_listing:

```
;========================================
; GLOBALS
;========================================
title [bist_test]
      .xlisti       ;turnoff include listings
;========================================
; MEMORY VARIABLES
;========================================
assume ds:dataseg
dataseg segment 'DATA' at 00000h    ;use same segment
                                    ;for ctl blk
;
org 0000h
;
dataseg ENDS
;========================================
; MAIN PROGRAM
;========================================
assume cs:program, ds:dataseg
program segment 'CODE' at 0f000h
;
org 00000h
start:
;    Initialization
;    Init LCS for 64k (00000h – 0ffffh)

mov    ax, 00f78h
     mov    ds:CTL_OFF+LMCS_REG, ax

;    Init ICS for 10000h – 17fffh mov    ax, 017ffh
     mov    ds:CTL_OFF+000ach, ax
;    Init MCS for ba000h – c2000h (base ba000, block size
;    32k/8k per mcs)

mov    ax, 0bbf8h
     mov    ds:CTL_OFF+MMCS_REG, ax
     mov    ax, 084b8h
     mov    ds:CTL_OFF+MPCS_REG, ax ;    Init SRAM to background pattern using DMA (IM0)

mov    ax,00000h      ;BACKGROUND PATTERN HERE!!!
     mov    ds:0fffeh,ax mov    ax,00000h      ;SRC0 = 0fffeh, DEST0 = 10000h
     mov    ds:CTL_OFF+DMA0_SRH,ax
```

-continued

```
        mov     ax, 00001h
        mov     ds:CTL_OFF+DMA0_DSH,ax
        mov     ax,0fffeh
        mov     ds:CTL_OFF+DMA0_SRC,ax
        mov     ax, 00000h
        mov     ds:CTL_OFF+DMA0_DES,ax ;       mov     ax,04000h       ;Transfer count 16k (words)
        mov     ax,00002h       ;Transter count 2 (test)
        mov     ds:CTL_OFF+DMA0_CNT,ax mov     ax,0b227h       ;Perform DMA
        mov     ds:CTL_OFF+DMA0_CTL,ax
        nop
        nop
        nop
        nop
        nop ;   Setup PIO(0) to enable DMA channels
        mov     ax,00000h
        mov     ds:CTL_OFF+PIO_DATA,ax
        mov     ds:CTL_OFF+PIO_DIRC,ax
        mov     ax,00001h
        mov     ds:CTL_OFF+PIO_ENAB,ax

;   IM1 mov     ax, ds:0fffeh           ;Background pattern
        not     ax                      ;Invert pattern
        mov     ds:0fffeh, ax           ;Put background just before SRAM ;   Setup DMA channels for sweep thru SRAM mov     ax,00000h       ;SRC0 = 0fffeh, DEST0 = 10000h
        mov     ds:CTL_OFF+DMA0_SRH,ax
        mov     ax,00001h
        mov     ds:CTL_OFF+DMA0_DSH,ax
        mov     ax,0fffeh
        mov     ds:CTL_OFF+DMA0_SRC,ax
        mov     ax,00000h
        mov     ds:CTL_OFF+DMA0_DES,ax mov     ax,00001h       ;SRC1 = 10000h, DEST1 = 0b0b0h
        mov     ds:CTL_OFF+DMA1_SRH,ax
        mov     ax,00000h
        mov     ds:CTL_OFF+DMA1_DSH,ax
        mov     ax,00000h
        mov     ds:CTL_OFF+DMA1_SRC,ax
        mov     ax,0b0b0h
        mov     ds:CTL_OFF+DMA1_DES,ax ;       mov     ax,04000h       ;Transfer count 16k (words)
        mov     ax,00002h       ;Transfer count 2 (test)
        mov     ds:CTL_OFF+DMA1_CNT,ax
        mov     ds:CTL_OFF+DMA0_CNT,ax mov     ax,09667h       ;Setup Control registers
        mov     ds:CTL_OFF+DMA1_CTL,ax
        mov     ax,0b667h
        mov     ds:CTL_OFF+DMA0_CTL,ax ;   Request the DMA's by toggling DRQ0 & DRQ1 tied to PIO(0)

mov     ax,00001h
        mov     ds:CTL_OFF+PIO_DATA,ax
        nop
        nop
        nop
        nop
        nop
        nop
        nop
        nop
        nop
        nop
        mov     ax,00000h       ;Turn off DRQ's
        mov     ds:CTL_OFF+PIO_DATA,ax

;   IM2
```

-continued

```
        mov     ax, ds:0fffeh           ;Background pattern
        not     ax                      ;Invert pattern
        mov     ds:0fffeh, ax           ;Put background just before SRAM ;   Setup DMA channels for sweep thru SRAM mov     ax,00000h       ;SRC0 = 0fffeh, DEST0 = 100000h
        mov     ds:CTL_OFF+DMA0_SRH,ax
        mov     ax,00001h
        mov     ds:CTL_OFF+DMA0_DSH,ax
        mov     ax,0fffeh
        mov     ds:CTL_OFF+DMA0_SRC,ax
        mov     ax,00000h
        mov     ds:CTL_OFF+DMA0_DES,ax mov     ax,00001h       ;SRC1 = 10000h, DEST1 = 0b0b0h
        mov     ds:CTL_OFF+DMA1_SRH,ax
        mov     ax,00000h
        mov     ds:CTL_OFF+DMA1_DSH,ax
        mov     ax,00000h
        mov     ds:CTL_OFF+DMA1_SRC,ax
        mov     ax,0b0b0h
        mov     ds:CTL_OFF+DMA1_DES,ax ;       mov     ax,04000h       ;Transfer count 16k (words)
        mov     ax,00002h       ;Transfer count 2 (test)
        mov     ds:CTL_OFF+DMA1_CNT,ax
        mov     ds:CTL_OFF+DMA0_CNT,ax mov     ax,09667h       ;Setup Control registers
        mov     ds:CTL_OFF+DMA1_CTL,ax
        mov     ax,0b667h
        mov     ds:CTL_OFF+DMA0_CTL,ax ;   Request the DMA's by toggling DRQ0 & DRQ1 tied to PIO(0)

mov     ax,00001h
        mov     ds:CTL_OFF+PIO_DATA,ax
        nop
        nop
        nop
        nop
        nop
        nop
        nop
        nop
        nop
        nop hlt
;
program ENDS END
end_listing
```

It is noted that several labels are used in the exemplary code. Table 1 below lists the labels and there corresponding hexadecimal values:

TABLE 1

Labels and Corresponding Values

| Label | Value |
|---|---|
| CTL_OFF | FB00 |
| LMCS_REG | A2 |
| MMCS_REG | A6 |
| MPCS_REG | A8 |
| DMA0_SRH | C2 |
| DMA0_DSH | C6 |
| DMA0_SRC | C0 |
| DMA0_DES | C4 |
| DMA0_CNT | C8 |
| DMA0_CTL | CA |

TABLE 1-continued

Labels and Corresponding Values

| Label | Value |
| --- | --- |
| DMA1_SRH | D2 |
| DMA1_DSH | D6 |
| DMA1_SRC | D0 |
| DMA1_DES | D4 |
| DMA1_CNT | D8 |
| DMA1_CTL | DA |
| PIO_DATA | 74 |
| PIO_DIRC | 72 |
| PIO_ENAB | 70 |

It is noted that the present discussion may refer to the assertion of various signals. As used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value. It is further noted that, although a microcontroller was used in the above embodiment, any integrated circuit having an integrated memory and DMA controller may employ the present invention.

In accordance with the above disclosure, a method for testing an integrated memory of an integrated circuit having an integrated DMA controller is described. The method uses the DMA controller to perform the BIST testing function. Therefore, the BIST logic may be deleted from the integrated circuit. Advantageously, the semiconductor area occupied by the BIST is saved. Additionally, the structure of the memory which previously included the BIST is simplified, possibly decreasing access times.

It will be appreciated by those skilled in the art having the benefit of this disclosure that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for testing a memory of an integrated circuit having an integrated DMA controller comprising:

initializing a plurality of storage locations comprising said memory to a predefined value;

performing a first DMA transfer in said DMA controller to access each of said plurality of storage locations; and performing a second DMA transfer in said DMA controller to update each of said plurality of storage locations to a complement of said predefined value.

2. The method as recited in claim 1 wherein said initializing comprises performing a third DMA transfer in said DMA controller to update each of said plurality of storage locations to said predefined value.

3. The method as recited in claim 1 wherein said DMA controller comprises a first DMA channel and a second DMA channel.

4. The method as recited in claim 3 wherein said first DMA channel is adapted to perform said first DMA transfer and said second DMA channel is adapted to perform said second DMA transfer.

5. The method as recited in claim 4 wherein said performing a first DMA transfer and said performing a second DMA transfer are performed concurrently.

6. The method as recited in claim 5 wherein said first DMA transfer and said second DMA transfer are source-synchronized.

7. The method as recited in claim 5 further comprising asserting a first signal upon a first DMA request pin of said integrated circuit, wherein said first DMA request pin corresponds to said first DMA channel, and concurrently asserting a second DMA request pin of said integrated circuit, wherein said second DMA request pin corresponds to said second DMA channel.

8. The method as recited in claim 1 wherein a destination of said first DMA transfer is a second storage location external to said memory.

9. The method as recited in claim 1 wherein said performing a second DMA transfer comprises accessing a first one of said plurality of storage locations, thereby obtaining a first value, and updating said second storage location with said first value.

10. The method as recited in claim 9 wherein said performing a second DMA transfer further comprises accessing a storage location external to said memory, thereby obtaining said complement of said predefined value, and updating said first one of said plurality of storage locations with said complement of said predefined value.

11. The method as recited in claim 10 wherein said accessing a storage location external is performed prior to said accessing said first one of said plurality of storage locations, whereby said first value comprises said complement of said predefined value.

12. The method as recited in claim 1 further comprising performing a fourth DMA transfer in said DMA controller to access each one of said plurality of storage locations.

13. The method as recited in claim 12 further comprising performing a fifth DMA transfer in said DMA controller to update each of said plurality of storage locations to said predefined value.

14. The method as recited in claim 13 further comprising repeating said first DMA transfer, said second DMA transfer, said fourth DMA transfer, and said fifth DMA transfer for a second predefined value dissimilar from said predefined value and a second complement of said second predefined value dissimilar from said complement of said predefined value.

15. The method as recited in claim 1 wherein said initializing, said performing a first DMA transfer, and said performing a second DMA transfer are performed in response to a plurality of test vectors provided by a tester.

16. An integrated circuit tested by the method as set forth in claim 1.

17. An integrated circuit comprising:

a memory comprising a plurality of storage locations integrated into said integrated circuit; and a DMA unit coupled to said memory, wherein said DMA unit is adapted during use to perform a first DMA transfer to update each of said plurality of storage locations to a predefined value and to perform a second DMA transfer to access each of said plurality of storage locations.

18. The integrated circuit as recited in claim 17 wherein said DMA unit comprises a first DMA channel and a second DMA channel.

19. The integrated circuit as recited in claim 18 wherein said DMA unit is adapted to perform said first DMA transfer and said second DMA transfer concurrently using said first DMA channel and said second DMA channel.

20. The integrated circuit as recited in claim 19 wherein said first DMA transfer includes a first access to a storage location external to said memory, thereby obtaining said predefined value.

21. The integrated circuit as recited in claim 20 wherein said first DMA transfer includes a first update to a first one of said plurality of storage locations, said first update providing said predefined value to said first one of said plurality of storage locations.

22. The integrated circuit as recited in claim 21 wherein said first DMA transfer includes a second access to said first one of said plurality of storage locations and a subsequent second update to a second one of said plurality of storage locations, whereby said second one of said plurality of storage locations is provided said predefined value.

23. The integrated circuit as recited in claim 22 wherein said DMA unit is further adapted to perform a third access to said first one of said plurality of storage locations on behalf of said second DMA transfer prior to said first update of said first one of said plurality of storage locations.

* * * * *